US012080988B2

(12) United States Patent
Schibli (10) Patent No.: US 12,080,988 B2
(45) Date of Patent: Sep. 3, 2024

(54) PHOTONIC-BASED MICROWAVE GENERATOR AND ASSOCIATED METHODS

(71) Applicant: The Regents of the University of Colorado, a body corporate, Denver, CO (US)

(72) Inventor: Thomas Richard Schibli, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 743 days.

(21) Appl. No.: 17/182,527

(22) Filed: Feb. 23, 2021

(65) Prior Publication Data

US 2022/0255632 A1    Aug. 11, 2022

Related U.S. Application Data

(60) Provisional application No. 62/980,616, filed on Feb. 24, 2020.

(51) Int. Cl.
*H01S 3/107*    (2006.01)
*H01S 3/00*    (2006.01)
(Continued)

(52) U.S. Cl.
CPC .......... *H01S 3/1307* (2013.01); *H01S 3/0078* (2013.01); *H01S 3/0085* (2013.01);
(Continued)

(58) Field of Classification Search
CPC .... H01S 3/0078; H01S 3/0085; H01S 3/0627; H01S 3/10038; H01S 3/10046;
(Continued)

(56) References Cited

U.S. PATENT DOCUMENTS 4,925,302 A  *  5/1990  Cutler .................. G02F 1/0327
                                                        356/128
6,516,014 B1 *  2/2003  Sellin .................... H01S 3/1303
                                                        372/18
(Continued)

FOREIGN PATENT DOCUMENTS

WO    WO 2017189060 A1 *  11/2017   ........... H01S 3/1618

OTHER PUBLICATIONS

Quinlan et al., Analysis of Shot Noise in the Detection of Ultrashort Optical Pulse Trains, J. Opt. Soc. Am. B, vol. 30, No. 6, dated Jun. 2013, pp. 1775-1785.
(Continued)

*Primary Examiner* — Levi Gannon
(74) *Attorney, Agent, or Firm* — Cozen O'Connor (57) ABSTRACT

A photonic-based microwave generator includes a mode-locked laser that generates an optical pulse train, a feedback photodiode that samples the optical pulse train, and a servo amplifier that processes the photodiode output into a servo signal. The servo signal controls the mode-locked laser to suppress relative intensity noise on the optical pulse train. The microwave generator may also include a microwave photodiode for converting the optical pulse train into a microwave signal. The microwave generator may also include a second servo amplifier that processes a low-frequency output of the microwave photodiode into a second servo signal that drives an optical modulator that modulates the optical pulse train. The microwave photodiode, optical modulator, and servo amplifier form a feedback loop that suppresses amplitude noise on the microwave signal. By reducing amplitude noise and relative intensity noise, phase noise caused by amplitude-to-phase noise conversion is minimized.

20 Claims, 4 Drawing Sheets

(51) Int. Cl.
*H01S 3/10* (2006.01)
*H01S 3/1118* (2023.01)
*H01S 3/13* (2006.01)
*H01S 3/131* (2006.01)

(52) U.S. Cl.
CPC .......... *H01S 3/10046* (2013.01); *H01S 3/107* (2013.01); *H01S 3/1118* (2013.01); *H01S 3/1304* (2013.01); *H01S 3/1305* (2013.01); *H01S 3/1306* (2013.01); *H01S 3/1312* (2013.01); *H01S 2301/02* (2013.01); *H04B 2210/006* (2013.01)

(58) Field of Classification Search
CPC .......... H01S 3/107; H01S 3/1118; H01S 3/13; H01S 3/1304; H01S 3/1305; H01S 3/1306; H01S 3/1307; H01S 3/1312; H01S 2301/02; H04B 2210/006
See application file for complete search history.

(56) References Cited

U.S. PATENT DOCUMENTS

| | | | | |
|---|---|---|---|---|
| 8,159,736 | B2* | 4/2012 | Maleki | G02F 1/0353 |
| | | | | 359/239 |
| 8,976,822 | B2* | 3/2015 | Maleki | H03B 17/00 |
| | | | | 372/28 |
| 9,252,795 | B2* | 2/2016 | Wilkinson | G04F 13/02 |
| 10,684,591 | B1* | 6/2020 | Burke | H01S 3/1303 |
| 2003/0142706 | A1* | 7/2003 | Kartner | H01S 3/1118 |
| | | | | 372/75 |
| 2004/0017833 | A1* | 1/2004 | Cundiff | H01S 3/1112 |
| | | | | 372/18 |
| 2013/0215918 | A1* | 8/2013 | Wilkinson | H01S 3/139 |
| | | | | 372/29.022 |
| 2014/0044142 | A1* | 2/2014 | Strandjord | H01S 3/1304 |
| | | | | 372/32 |
| 2015/0236789 | A1* | 8/2015 | Vahala | H03L 7/16 |
| | | | | 398/192 |
| 2016/0043810 | A1* | 2/2016 | Quinlan | H04B 10/90 |
| | | | | 398/208 |
| 2017/0264070 | A1* | 9/2017 | Cingoz | H01S 3/1106 |
| 2020/0295525 | A1* | 9/2020 | Maker | H01S 3/1312 |

OTHER PUBLICATIONS

Haboucha et al., Optical-Fiber Pulse Rate Multiplier for Ultralow Phase-Noise Signal Generation, Optics Letters, vol. 26, No. 18, dated Sep. 15, 2011, pp. 3654-3656.

Quinlan, et al., Optical Amplification and Pulse Interleaving for Low-Noise Photonic Microwave Generation, Optics Letters, vol. 39, No. 6, dated Mar. 15, 2014, pp. 1581-1584.

Quinlan et al., Exploiting Shot Noise Correlations in the Photodetection of Ultrashort Optical Pulse Trains, Nature Photonics, published Mar. 10, 2013, 15 pages.

Shoji, et al., Ultra-Low-Noise Monolithic Mode-Locked Solid-State Laser, Optica, vol. 3, No. 9, dated Sep. 2016, pp. 995-998.

* cited by examiner

PHOTONIC-BASED MICROWAVE GENERATOR AND ASSOCIATED METHODS

RELATED APPLICATIONS

This application claims priority to U.S. Provisional Patent Application No. 62/980,616, titled "Microwave Generator and Microwave Generation Method" and filed Feb. 24, 2020, the entirety of which is incorporated by reference.

STATEMENT REGARDING FEDERALLY SPONSORED RESEARCH OR DEVELOPMENT

This invention was made with government support under grant numbers N66001-11-1-4156, W31P4Q-14-1-0001, and W31P4Q-18-C-0002 awarded by DOD/DARPA. The government has certain rights in the invention.

BACKGROUND

Low phase-noise microwave signals have broad applications in fields such as radar, long baseline interferometry, high-speed sampling, navigation, and telecommunication. Electronic low-phase-noise X-band (8-12 GHz) oscillators rely on microwave resonators with high quality factors. However, at room temperature, even quartz resonators or sapphire-loaded cavities provide relatively modest Q factors of $\sim 10^5$. Passive optical cavities, on the other hand, have Q-factors in excess of $10^{10}$ at room temperature. Photonic microwave generation via optical frequency division (OFD) can be used to transfer the high stability of an optical reference to the microwave domain, allowing the generation of ultra-low phase noise microwave signals. Recent work demonstrated the generation of microwaves via an actively stabilized low-noise fiber-based optical frequency comb (OFC), resulting in phase noise below −173 dBc/Hz at 10 kHz offset frequency for a 12-GHz carrier. However, such OFD systems are much more complex than traditional microwave sources, as they require a high-finesse optical cavity in vacuum and an actively stabilized OFC.

SUMMARY

The present embodiments include systems and methods for generating ultra-low phase noise microwave signals carrier from a free-running mode-locked laser. The mode-locked laser may be a monolithic solid-state mode-locked laser built from a low-loss and low-dispersion $CaF_2$ cavity spacer combined with an Er:Yb:glass gain medium and a semiconductor saturable absorber mirror to initiate and maintain mode-locked operation with a pulse duration of 150 fs. The total cavity roundtrip loss is less than 1%, and the intracavity average power exceeds 10 W. These key parameters enable ultra-low quantum noise-limited phase performance of ~160 dBc/Hz at 1 kHz, ~191 dBc/Hz at 10 kHz and ~213 dBc/Hz at 100-kHz offset frequencies, respectively, at a 1-GHz repetition rate.

Advantageously, the present embodiments do not need a high-finesse optical cavity or active phase stabilization (i.e., phase-locking of the laser repetition rate and carrier-envelope offset frequency), as typically used by systems based on optical frequency division (OFD). By eliminating these requirements, the present embodiments have substantially reduced size, weight, and power consumption, in turn enabling applications that require ultra-low phase noise microwave signals. Despite the simplicity of this approach, the measured phase noise lies within ~10 dB of the lowest phase noises achieved with state-of-the-art OFD systems, which are many orders of magnitudes larger and require significantly greater power to operate.

Some of the present embodiments reduce phase noise on the microwave signal by suppressing residual intensity noise (RIN) of the mode-locked laser's optical output. In these embodiments, a photonic-based microwave generator includes a mode-locked laser for generating an optical pulse train, a feedback photodiode for sampling the optical pulse train, and a servo amplifier for processing an output of the feedback photodiode into a servo signal that controls the mode-locked laser to suppress RIN of the optical pulse train. The servo signal may be used to modulate pump light that pumps the mode-locked laser. Alternatively or additionally, the servo signal may be used to modulate intra-cavity loss of the mode-locked laser. The photonic-based microwave generator may also include a microwave photodiode for converting the optical pulse train into an electronic microwave signal.

Some of the present embodiments reduce phase noise on the microwave signal by suppressing amplitude noise on this microwave signal. This suppression reduces phase noise arising from amplitude-to-phase noise conversion that may occur in a microwave circuit that receives the signal. In these embodiments, a photonic-based microwave generator includes a mode-locked laser for generating an optical pulse train, an optical modulator for modulating an optical power of the optical pulse train, a microwave photodiode for converting the optical pulse train into an electronic microwave signal, and a servo amplifier for processing an output of the microwave photodiode into a servo signal. When the servo signal drives the optical modulator, the microwave photodiode, optical modulator, and servo amplifier cooperate to suppress amplitude noise of the electronic microwave signal.

In other embodiments, a method for photonic-based microwave generation includes generating an optical pulse train with a mode-locked laser and suppressing RIN of the optical pulse train by (i) sampling, with a feedback photodiode, the optical pulse train, (ii) processing an output of the feedback photodiode into a servo signal, and (iii) controlling the mode-locked laser with the servo signal.

In other embodiments, a method for photonic-based microwave generation includes generating an optical pulse train with a mode-locked laser and converting, with a microwave photodiode, the optical pulse train into a microwave electronic signal. The method also includes suppressing amplitude noise of the electronic microwave signal.

BRIEF DESCRIPTION OF THE FIGURES

FIG. 2 is a schematic of the microwave generation and characterization setup, in an embodiment. The top of FIG. 2 shows microwave generation using a free-running mode-locked monolithic laser. The phase noise was measured using a Mach-Zehnder modulator-based electro-optic (EO) sampling technique shown in the bottom of FIG. 2. The repetition rate of the MMLL is stabilized to the optical reference using a slow feedback bandwidth (FB BW) loop. The optical reference is a cavity stabilized 500-MHz optical frequency comb. MMLL: mode-locked monolithic laser, PD: photodiode, OFC: optical frequency comb, LF: loop filter, AOM: acousto-optic modulator, EDFA: erbium-doped fiber amplifier, PBS: polarized beam splitter, QWP: quarter-wave plate, Inst. Amp.: instrumentation amplifier, R: shunt resistor, Bias-T: bias tee, BPF: bandpass filter, MUTC: modified uni-traveling carrier photodiode, BPD: balanced photodetector, TIA: transimpedance amplifier, LNA: low-noise amplifier, DO-MZM: dual-output Mach-Zehnder modulator, AMP: RF amplifier, FPGA: field-programmable gate array.

DETAILED DESCRIPTION

Figure 1:
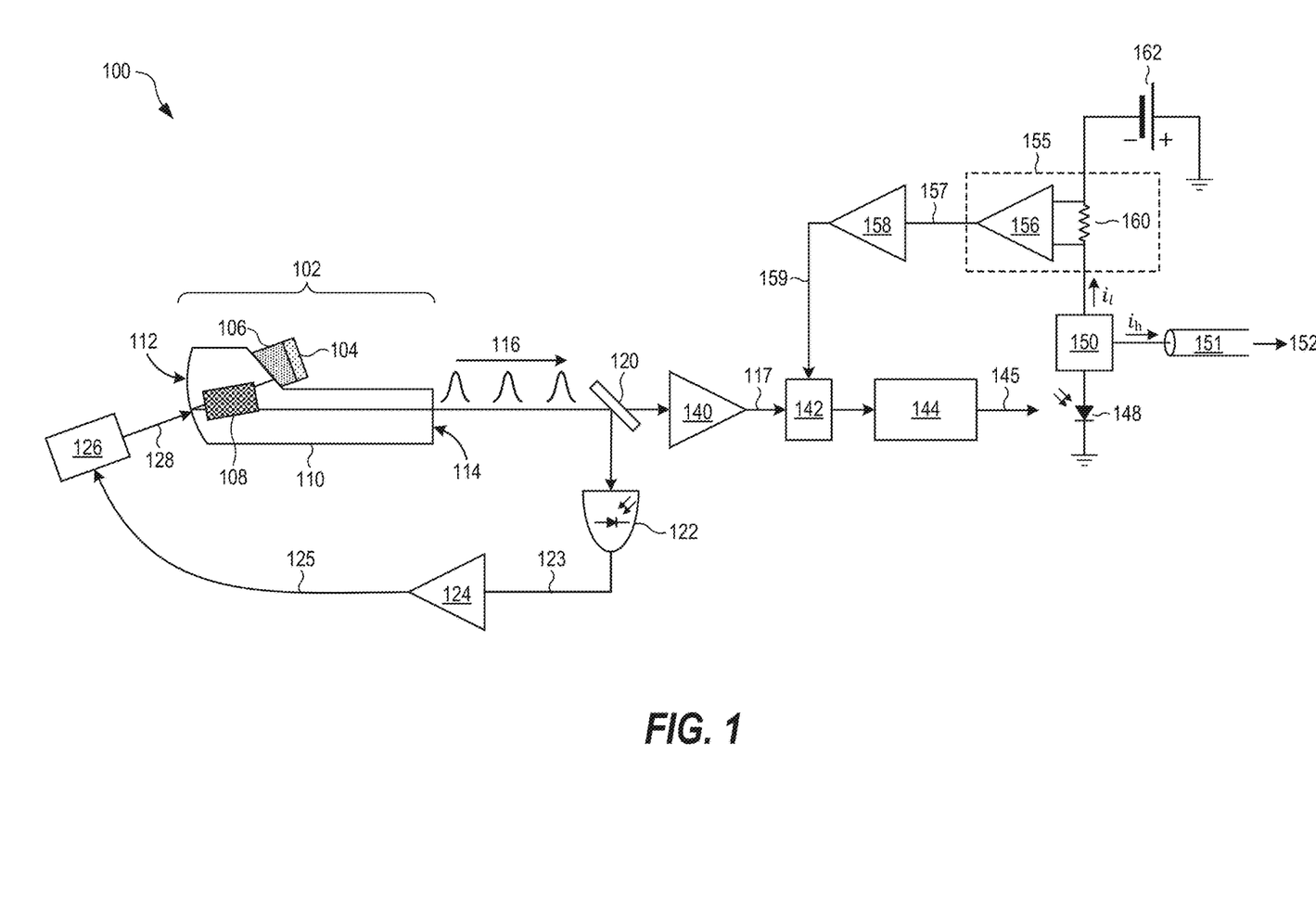
FIG. 1 shows a photonic-based microwave generator 100 that uses a mode-locked laser 102 to generate an electronic microwave signal 152, in an embodiment.

FIG. 1 shows a photonic-based microwave generator 100 that uses a mode-locked laser 102 to generate an electronic microwave signal 152. The mode-locked laser 102 outputs an optical pulse train 116 that is detected by a microwave photodiode 148. The microwave photodiode 148 outputs a photocurrent that forms the microwave signal 152, which has frequency components at a pulse-train repetition rate $f_{rep}$ of the optical pulse train 116 and harmonics thereof. The number of harmonics in the microwave signal 152 depends on the bandwidth of the microwave photodiode 148. Although not shown in FIG. 1, a bandpass filter (e.g., see bandpass filter BPF in FIG. 2) may be used to suppress all but one of the frequency components such that the microwave signal 152 approximates a sine wave.

The photonic-based microwave generator 100 generates the electronic microwave signal 152 with less phase noise than other types of microwave sources. In the example of FIG. 1, the mode-locked laser 102 is a monolithic solid-state mode-locked laser featuring greater mechanical stability than non-monolithic laser architectures (e.g., fiber, Kerr-lens, etc.) and therefore may operate free-running with minimal, if any, impact on the phase noise of the microwave signal 152. Here, "free-running" means that the mode-locked laser 102 operates without active frequency stabilization of the repetition rate $f_{rep}$ and carrier-envelope offset frequency $f_{ceo}$. Without active frequency stabilization, the photonic-based microwave generator 100 does not need an optical cavity, thereby reducing size, power consumption, and complexity when compared to prior-art photonic-based microwave sources that do use an optical cavity.

In FIG. 1, the mode-locked laser 102 uses Yb:Er:glass as a gain medium 106. Affixed to one facet of the gain medium 106 is a semiconductor saturable absorber mirror (SESAM) 104 that initiates and sustains mode-locking. A second facet of the gain medium 106 is affixed to a spacer 102 fabricated from of $CaF_2$. The spacer 102 may be fabricated from a single piece of $CaF_2$ or from two or more pieces of $CaF_2$ that are epoxied or bonded together. An output facet 114 of the spacer 102 has a mirror coating deposited thereon, and a pump facet 112 of the spacer 102 has a third-order dispersion-compensating Gires-Tournois interferometer coating deposited thereon. The SESAM 104, output face 114, and pump facet 112 define a laser cavity whose optical path length determines the repetition rate $f_{rep}$.

Pump light 128 is coupled into the laser cavity through the pump facet 112. For Yb:Er:glass, the pump light 128 may be generated by a pump laser 126 near 980 nm. In this case, a center wavelength of the optical pulse train 116 lies between 1500 and 1600 nm, which advantageously facilitates the use of conventional telecom fiber-optic components. The mode-locked laser 102 may include a piezoelectric transducer 108 for changing the repetition rate $f_{rep}$, and therefore the frequency of the electronic microwave signal 152. Additional details about the monolithic solid-state mode-locked laser 102 shown in FIG. 1 can be found in T. D. Shoji et al., "Ultra-low-noise monolithic mode-locked solid-state laser", Optica 3, 995-998 (2016).

The mode-locked laser 102 may use other a different material than Yb:Er:glass for the gain medium 106, in which case the center wavelength of the optical pulse train 116 may lie in a different part of the electromagnetic spectrum (e.g., x-ray, visible, near infrared, etc.). Similarly, the spacer 102 may be fabricated from a different material than $CaF_2$ without departing from the scope hereof. Similarly, the mode-locked laser 102 may have a different geometry than shown in FIG. 1 (e.g., cavity path length, number and location of facets, types of mirror coatings, type of SESAM, etc.) without departing from the scope hereof.

The photonic-based microwave generator 100 uses feedback to suppress relative intensity noise (RIN) of the optical pulse train 116 that would otherwise be converted into phase noise of the electronic microwave signal 152. This feedback is referred to herein as "laser RIN suppression". As an example of laser RIN suppression, the microwave generator 100 includes a feedback photodiode 122 that samples the optical pulse train 116, and a servo amplifier 124 that processes the output of the feedback photodiode 122 to generate a servo signal 125 for modulating the pump light 128. The power of the optical pulse train 116 varies (approximately) linearly with the pump light. Accordingly, the feedback photodiode 122 and servo amplifier 124 cooperate with the mode-locked laser 102 to form a feedback loop that controls pumping of the mode-locked laser 102 to reduce RIN of the optical pulse train 116 that originates in the mode-locked laser 102.

To sample the optical pulse train 116, a beamsplitter 120 (e.g., a piece of glass) reflects a portion (e.g., 2%) of the optical pulse train 116 onto the feedback photodiode 122. The servo amplifier 124 may include a proportional (P), proportional-integral (PI), or proportional-integral-derivative (PID) circuit to convert the output signal 123 into the servo signal 125. In any case, the servo signal 125 may be used to directly control the pump laser 126, as shown in FIG. 1. For example, when the pump laser 126 is a laser diode, the servo signal 125 may be used to modulate an electrical current driving the laser diode, thereby modulating the power of the pump light 128. Alternatively, the servo signal 125 may be used to drive an optical modulator (e.g., an acousto-optical modulator or electro-optic modulator) that is external to the pump laser 126 and that directly modulates the power of the pump light 128.

In some embodiments, the feedback loop implementing laser RIN suppression is closed by modulating intra-cavity loss, either alternatively or additionally to modulating the power of the pump light 128. In these embodiments, the servo signal 125 drives an intra-cavity modulator (not shown in FIG. 1) within the laser cavity of the mode-locked laser 102 to modulate the intra-cavity loss. The intra-cavity modulator may be an acousto-optical modulator, electro-optic modulator, stark modulator, graphene, semiconductor absorber, or another kind of optical element implementing an electronically-controlled attenuator. Regardless of how the feedback is closed, the servo signal 125 controls the mode-locked laser 102 such that the mode-locked laser 102 generates the optical pulse train 116 with suppressed RIN.

In some embodiments, the photonic-based microwave generator 100 includes the microwave photodiode 148. To increase the signal-to-noise ratio (SNR) of the electronic microwave signal 152, the microwave photodiode 148 may be a modified uni-traveling carrier (MUTC) photodiode that features higher linearity and power handling than conventional pin photodiodes. The microwave photodiode 148 is reverse biased with a voltage source 162, and the bias voltage across the microwave photodiode 148 may be selected such that the microwave photodiode 148 operates at a point where amplitude-to-phase noise conversion is minimized.

A frequency multiplexer 150 separates a low-frequency photocurrent $i_l$ from a high-frequency photocurrent $i_h$. The high-frequency photocurrent $i_h$ is coupled out of a high-frequency port of the multiplexer 150 and into a transmission line 151 (e.g., a coaxial cable) to form the electronic microwave signal 152. Although not shown in FIG. 1, the transmission line 151 may be connected to a microwave circuit, or load, that uses the microwave signal 152 for the application at hand (e.g., see electro-optic sampling in FIG. 2). The photocurrent $i_l$ is "low-frequency" in that it includes all frequency components up to a fraction of the repetition rate $f_{rep}$, while the photocurrent $i_h$ is "high-frequency" in that it includes only components at $f_{rep}$ and harmonics thereof. Although not shown in FIG. 1, the multiplexer 150 may include one or more components (e.g., DC blocking capacitor, impedance transformer, quarter-wave stub, etc.) to match the output impedance of the high-frequency port to the characteristic impedance of the transmission line 151 (e.g., 50Ω), and therefore the impedance of the load.

In some embodiments, the photonic-based microwave generator 100 uses feedback to suppress amplitude noise of the electronic microwave signal 152 that would otherwise be converted into phase noise by the load (e.g., a bandpass filter, power splitter, amplifier, etc.). This feedback is referred to herein as "amplitude noise suppression". As an example of amplitude noise suppression, a current-sense amplifier 155 outputs a voltage signal 157 that is proportional to the low-frequency photocurrent $i_l$. The current-sense amplifier 155 may include an instrumentation amplifier 156 that senses the voltage drop across a sense resistor 160 when the low-frequency photocurrent $i_l$ passes through the sense resistor 160. A servo amplifier 158 converts the voltage signal 157 into a servo signal 159 that drives an optical modulator 142 to modulate the power of the optical pulse train 116. The optical modulator 142 may be an acousto-optic modulator, electro-optic modulator, liquid-crystal modulator, or another type of electronically-controlled optical attenuator. The servo amplifier 158 may include a proportional (P), proportional-integral (PI), or proportional-integral-derivative (PID) circuit.

To further increase the SNR of the electronic microwave signal 152, some of the present embodiments include an optical amplifier 140 that amplifies the optical pulse train 116 into an amplified pulse train 117. The optical amplifier 140 may be a fiber amplifier, such as an erbium-doped fiber amplifier or ytterbium-doped fiber amplifier. In these embodiments, the microwave photodiode 148 detects the amplified pulse train 117 to generate the electronic microwave signal 152. The optical amplifier 140 may be controlled such that the power of the amplified pulse train 117 uses the full dynamic range of the microwave photodiode 148. When amplitude noise suppression is included, the optical modulator 142 may be placed before or after the optical amplifier 140. In either case, amplitude noise or RIN originating from the optical amplifier 140 will be detected by the microwave photodiode 148 and therefore reduced via the amplitude noise suppression.

To further increase the SNR of the electronic microwave signal 152, some of the present embodiments implement the mode-locked laser 102 with a laser cavity having a short optical path length. Decreasing this optical path length increases the pulse-train repetition rate $f_{rep}$, which reduces the peak power of the optical pulse train 116 relative to its time-averaged power, thereby preventing saturation of the microwave photodiode 148. Increasing $f_{rep}$ also reduces the number of harmonics detected by the microwave photodiode 148, which advantageously results in more power detected in each frequency component. Increasing $f_{rep}$ also reduces the size of the mode-locked laser 102, advantageously increasing its robustness to mechanical vibrations and environmental perturbations. Accordingly, in some embodiments, the mode-locked laser 102 has a repetition rate $f_{rep}$ of 1 GHz, or more. However, the mode-locked laser 102 may have any repetition rate $f_{rep}$ without departing from the scope hereof.

To further increase the SNR of the electronic microwave signal 152, some of the present embodiments include a pulse interleaver 144 that interleaves the optical pulse train 116 to generate an interleaved pulse train 145. The interleaved pulse train 145 has an interleaved repetition rate of $2^N f_{rep}$, where N is the number of stages of the pulse interleaver 144. As shown in FIG. 1, the microwave photodiode 148 detects the interleaved pulse train 145 and the electronic microwave signal 152 will therefore have a fundamental frequency of $2^N f_{rep}$. For example, when $f_{rep}=1$ GHz and N=3, the fundamental frequency of the electronic microwave signal 152 will be 8 GHz (ignoring residual components at 1 GHz, 2 GHz, and 4 GHz that may arise from imperfect pulse delays within each stage of the pulse interleaver 144). A different value of N (e.g., 1, 2, 4, 5, 6, 10, etc.) may be used without departing from the scope hereof. While the pulse interleaver 144 is shown in FIG. 1 being located after the optical modulator 142, the optical modulator 142 may be alternatively located after the pulse interleaver 144 or before the optical amplifier 140 without departing from the scope hereof.

Advantageously, the interleaved pulse train 145, when compared to the optical pulse train 116, has a peak power that is lower by a factor of $2^N$, which allows more power to be detected without saturating the microwave photodiode 148. Detecting the interleaved pulse train 145 instead of the optical pulse train 116 (or the amplified pulse train 117) also reduces the number of harmonics detected by the microwave photodiode 148, which advantageously results in more power detected each frequency component. Accordingly, the pulse interleaver 145 helps achieve a higher SNR when the fundamental frequency of the microwave signal 152 is a multiple of $f_{rep}$.

While FIG. 1 shows the mode-locked laser 102 as a monolithic solid-state mode-locked laser, the present embodiments may use another type of laser architecture (e.g., non-monolithic) without departing from the scope hereof. Examples of such laser architectures include solid-state Kerr-lens mode-locked lasers in a "open" (i.e., non-monolithic) cavity, fiber mode-locked lasers, and mode-locked diode lasers. In the latter case, the servo signal 125 may be used to control the electrical current powering the diode laser. Regardless of laser architecture, the mode-locked laser 102 may be free-running.

In other embodiments, the photonic-based microwave generator 100 includes amplitude noise suppression and excludes laser RIN suppression. For example, the microwave generator 100 may include the current-sense amplifier 155, servo amplifier 158, and optical modulator 142 to implement amplitude noise suppression, yet exclude the beamsplitter 120, feedback photodiode 122, and servo amplifier 124. In some of these embodiments, the microwave generator 100 may include one or both of the optical amplifier 140 and pulse interleaver 144. In some of these embodiments, the mode-locked laser 102 is a monolithic solid-state mode-locked laser, as shown in FIG. 1. The mode-locked laser 102 may operate free-running.

In embodiments, a method for photonic-based microwave generation includes generating an optical pulse train with a mode-locked laser. For example, the mode-locked laser 102 of FIG. 1 generates the optical pulse train 116. The mode-locked laser may be monolithic, such as the monolithic solid-state mode-locked laser 102 shown in FIG. 1. Alternatively or additionally, the mode-locked laser may be free-running. The method also includes suppressing RIN of the optical pulse train by (i) sampling, with a feedback photodiode, the optical pulse train, (ii) processing an output of the feedback photodiode into a servo signal, and (iii) controlling the mode-locked laser with the servo signal. For example, the feedback photodiode 122 of FIG. 1 samples the optical pulse train 116 and the servo amplifier 124 processes the output signal 123 to generate the servo signal 125 used to modulate the pump light 128. The method may further include pumping the mode-locked laser with the pump light.

In some of these embodiments, the method further includes converting, with a microwave photodiode, the optical pulse train into a microwave electronic signal. For example, the microwave photodiode 148 of FIG. 1 may be used to directly detect the optical pulse train 116 to generate the electronic microwave signal 152. The method may further include coupling the electronic microwave signal 152 to a microwave circuit (e.g., via the transmission line 151 of FIG. 1). The method may also include amplifying the optical pulse train into an amplified pulse train, in which case said converting may include converting the amplified pulse train into the microwave electronic signal. For example, the optical amplifier 140 of FIG. 1 amplifies the optical pulse train 116 into the amplified pulse train 117. The microwave detector 148 may then be used to directly detect the amplified pulse train 117 to generate the electronic microwave signal 152.

In some of these embodiments, the method further includes interleaving the optical pulse train into an interleaved pulse train, in which case said converting includes converting the interleaved pulse train into the electronic microwave signal. For example, the pulse interleaver 144 of FIG. 1 interleaves the amplified pulse train 117 into the interleaved pulse train 145 that is directly detected by the microwave photodiode 148.

In some of these embodiments, the method further includes suppressing amplitude noise of the electronic microwave signal. Said suppressing may include processing an output of the microwave photodiode into a second servo signal, and modulating, with the second servo signal, an optical power of the amplified pulse train. Said processing may include detecting, with a current-sense amplifier, a photocurrent outputted the microwave photodiode, and converting a voltage signal outputted by the current-sense amplifier into the second servo signal. For example, the current-sense amplifier 155 of FIG. 1 detects the low-frequency photocurrent $i_l$ to generate the voltage signal 157. The servo amplifier 158 then converts the voltage signal 157 into the servo signal 159 for driving the optical modulator 142.

In other embodiments, a method for photonic-based microwave generation includes generating an optical pulse train with a mode-locked laser and converting, with a microwave photodiode, the optical pulse train into a microwave electronic signal. The mode-locked laser may be monolithic, such as the monolithic solid-state mode-locked laser 102 of FIG. 1. Alternatively or additionally, the mode-locked laser may be free-running. The method also includes suppressing amplitude noise of the electronic microwave signal. Said suppressing may include processing an output of the microwave photodiode into a servo signal and modulating, based on the servo signal, an optical power of the optical pulse train. The method may exclude laser RIN suppression.

In some of these embodiments, the method further includes amplifying the optical pulse train into an amplified pulse train, in which case said converting may include converting the amplified pulse train into the microwave electronic signal. In some of these embodiments, the method further includes interleaving the optical pulse train into an interleaved pulse train, in which case said converting includes converting the interleaved pulse train into the electronic microwave signal. The method may further include coupling the electronic microwave signal 152 to a microwave circuit (e.g., via the transmission line 151 of FIG. 1).

Experimental Demonstration

Phase noise performance of photonic microwave systems, such as optical frequency division (OFD), can surpass state-of-the-art electronic oscillators by several orders of magnitude. However, high-finesse cavities and active stabilization requirements in OFD systems make them complicated and potentially unfit for field deployment. Ultra-low noise mode-locked monolithic lasers offer a viable alternative for a compact and simple photonic microwave system. In this section, we present a free-running monolithic laser-based 8 GHz microwave generation with ultra-low phase noise performance comparable to laboratory OFD systems.

Introduction—Ultra-low phase noise X-band (8-12 GHz) microwaves are of great interest due to their growing demand in many fields such as high-performance radar systems, communication, time-frequency metrology, and signal measurement instrumentation. The recent attraction towards mobile, airborne, and space applications of ultra-low noise X-band microwaves requires microwave oscillators that offer smaller size, weight, and power consumption (SWaP). Conventional mobile high-performance X-band oscillators rely on electronic resonators such as sapphire loaded cavities (SLCs), which serve as a frequency discriminator (FD) to achieve low phase noise performance. However, the relatively modest quality factor (Q-factor) of room-temperature SLCs and other technical limitations, such as carrier signal reflection, limit the achievable microwave spectral purity of these oscillators. Several photonics-based approaches have addressed some of these limitations with ultra-low noise performance with wide tunability. The optical frequency comb (OFC)-based phase-coherent optical frequency division (OFD) scheme has demonstrated a superior phase noise performance compared to other methods with zeptosecond-level timing noise.

OFD-based microwaves are achieved via photo-detecting of an ultra-stable optical pulse train from an OFC, which transfers the stability from the optical to the microwave domain. Current commercial OFCs are compact and robust. The free-running intrinsic noise of these OFCs, however, is not sufficiently low for microwave generation, and therefore, require external stabilization of the repetition rate $f_{rep}$ and the carrier-envelope offset frequency $f_{ceo}$ with wide feedback bandwidth. The $f_{rep}$ of an OFC is stabilized by tightly locking one of the comb modes to an ultra-stable optical reference, which is commonly derived from a continuous wave (CW) laser actively locked to an ultra-low expansion (ULE) Fabry-Pérot (FP) cavity in a vacuum. The $f_{ceo}$ stabilization is achieved via an f-2f interferometer, which requires an octave-spanning optical spectrum. Such broad spectra are typically obtained via supercontinuum generation, which often requires pulse amplification. The optical cavity and supercontinuum generation requirements dramatically increase the SWaP and the complexity of the system, making traditional OFDs less desirable for mobile applications.

We demonstrate a novel approach to X-band photonic microwave generation using a free-running, quantum noise-limited, monolithic mode-locked laser (MMLL). The proposed method relies on the ultra-low intrinsic noise of the MMLL and does not require any $f_{ceo}$ or $f_{rep}$ stabilization. This significantly reduces the complexity and SWaP of the system compared to a traditional OFD scheme. With this approach, we demonstrate a phase noise performance of −130 dBc/Hz at 100 Hz offset, −150 dBc/Hz at 1 kHz offset and −167 dBc/Hz at 10 kHz offset for an 8-GHz carrier with a thermal-noise-limited sub-Poissonian shot noise floor of −179 dBc/Hz above 30 kHz (Johnson-noise-limited timing noise floor of ~32 zs $Hz^{-1/2}$, measured in the microwave domain at 8 GHz). The phase noise performance of this system surpasses the similar earlier attempts of using a free-running fiber-based OFC for ultra-low noise microwave generation by more than 23 dB at 10 kHz offset for an 8-GHz carrier. Compared to the recently demonstrated free-running OFC transfer oscillator based microwave generation approach, this system is better than ~20 dB at 10 kHz offset, scaled to an 8-GHz carrier. Furthermore, this free-running MMLL based system outperforms the current soliton microcomb approaches by more than 50 dB. The phase noise performance reported here is comparable to state-of-the-art OFDs, but with smaller physical footprint and about an order of magnitude lower power consumption.

Figure 2:
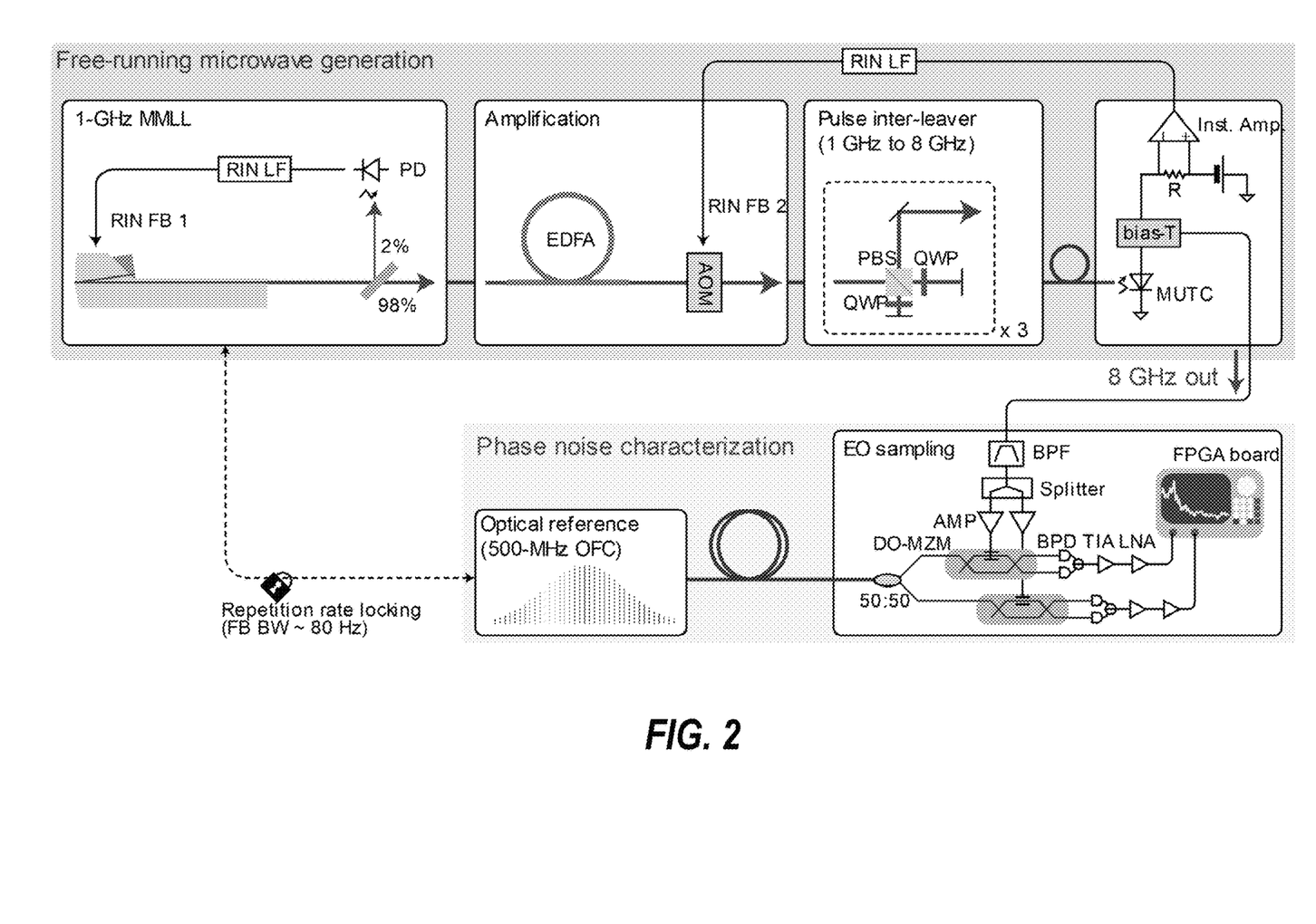

Experimental Setup—FIG. 2 shows a schematic of the microwave generation setup. It includes a free-running 1-GHz MMLL as the quantum-noise-limited optical oscillator, an erbium-doped fiber amplifier (EDFA) for optical pulse amplification, an acousto-optic modulator (AOM) to suppress the relative intensity noise (RIN), a three-stage pulse interleaver for repetition rate multiplication, and a modified uni-traveling carrier photodiode (MUTC) for microwave generation.

The MMLL laser is built from a low-loss $CaF_2$ spacer combined with an Er:Yb:glass gain medium and a semiconductor saturable absorber mirror (SESAM) to initiate and maintain mode-locking. $CaF_2$ offers excellent transparency and near-zero second-order dispersion at 1550 nm, which is important for low-noise operation. The third-order dispersion is compensated through a Gires-Tournois interferometer (GTI) coating, which is directly deposited onto the $CaF_2$ spacer. The SESAM, which initiates and maintains the mode-locked operation, is an InGaAs quantum-well grown on an AlGaAs/GaAs Bragg stack. The laser output is a 1-GHz $sech^2$-shaped pulse train with a pulse duration of ~150 fs at a center wavelength of 1557 nm. The simulated free-running performance of this monolithic laser is −160 dBc/Hz at 1 kHz, −191 dBc/Hz at 10 kHz and −213 dBc/Hz at 100 kHz offset frequencies at the 1 GHz repetition frequency. The optical power output of the MMLL is 35 mW. Approximately 2% of the light from the MMLL is diverted to an InGaAs PIN photodiode (PD, Hamamatsu, G12180-003A) for measuring and suppressing the relative intensity noise (RIN) of the MMLL.

The EDFA amplifies the rest of the output of the MMLL to 50 mW. The amplified 1-GHz optical pulse train then traverses a three-stage optical pulse interleaver based on polarized beam splitters (PBSs) and quarter-wave plates (QWPs) to obtain the desired 8-GHz pulse-train repetition rate. The repetition rate multiplication reduces the peak optical power of the pulses and concentrates the power in the desired harmonic (8 GHz), which reduces the saturation effects in the MUTC. However, a small timing delay error in the pulse interleaver can significantly increase the phase noise floor of the microwave. In the experiment, each interleaving stage is carefully tuned to minimize the timing delay errors and to achieve +2 dBm microwave power at the 8-GHz carrier at the output of the bias tee.

The RIN on the microwave signal is directly measured via a 5Ω shunt resistor (R) placed in series with the bias voltage supply of the MUTC detector and is monitored with an instrumentation amplifier (Inst. Amp.) with a gain bandwidth of ~1 MHz. A proportional controller is used to suppress this RIN using an AOM operating in zero-order mode and driven by an amplitude modulated 80 MHz carrier to effectively produce a voltage-controlled optical attenuator. This AOM is placed before the optical pulse interleaver. This RIN feedback loop has an effective bandwidth of ~350 kHz and yields more than 10 dB of RIN suppression below 100 kHz. The MUTC is operated at 6 V reverse bias to minimize the amplitude to phase noise conversion (AM-PM conversion), which originates primarily from the increased response time caused by space charge effects in the detector. The AM-PM conversion factor, measured by adding an AM tone on the optical pulse train, was found to be about −58 dB at the 8-GHz carrier, said bias voltage, and a 7-mA photocurrent. The total power consumption of this microwave generation scheme is less than 9 W (2 W for MMLL, 2 W for EDFA, 2 W for AOM driver, and <3 W for RIN servos and MUTC bias), which is about an order of magnitude less than a traditional OFD system (>100 W).

The bottom of FIG. 2 shows our approach to characterize the generated microwaves by a direct electro-optic comparison technique involving two dual-output Mech-Zehnder modulators (DO-MZM, EOSPACE, AX-2x2-0S5-10-PFA-PFA) combined with a cross-spectrum technique. The DO-MZMs optically sample the microwave signal against a $f_{rep}$ and $f_{ceo}$ stabilized OFC operating at 500 MHz ($1/16^{th}$ of the microwave carrier frequency). The time-averaged cross-spectrum between two channels yields the desired phase-noise data free of statistically independent instrumentation noise that is typically present in each channel. The latter includes flicker noise of the DO-MZMs, RF amplifiers, and baseband diodes, as well as electronic noise from RF and baseband amplifiers, and shot-noise due to the photocurrent on these baseband diodes. An FPGA sampling board (modified Red Pitaya STEMLab 125-14) was used to achieve ~30 dB suppression of these statistically independent noise terms with less than 5 minutes of averaging (4 kHz RBW). The drawback of this homodyne method is that the device-under-test (DUT) must have the same repetition rate (or a harmonic thereof) of the reference OFC. Therefore, during the measurements, the repetition rate of the monolithic laser is matched to the 16$^{th}$ harmonic of the reference OFC with a feedback bandwidth of ~80 Hz. The phase noise data below this loop bandwidth is in-loop, and hence, is not presented here. The reason a homodyne method was chosen is the large dynamic range of the phase noise power spectrum of >180 dB (from the inverse measurement time to ~1 MHz), which far exceeds the dynamic range of any high-speed sampling board.

Figure 3:
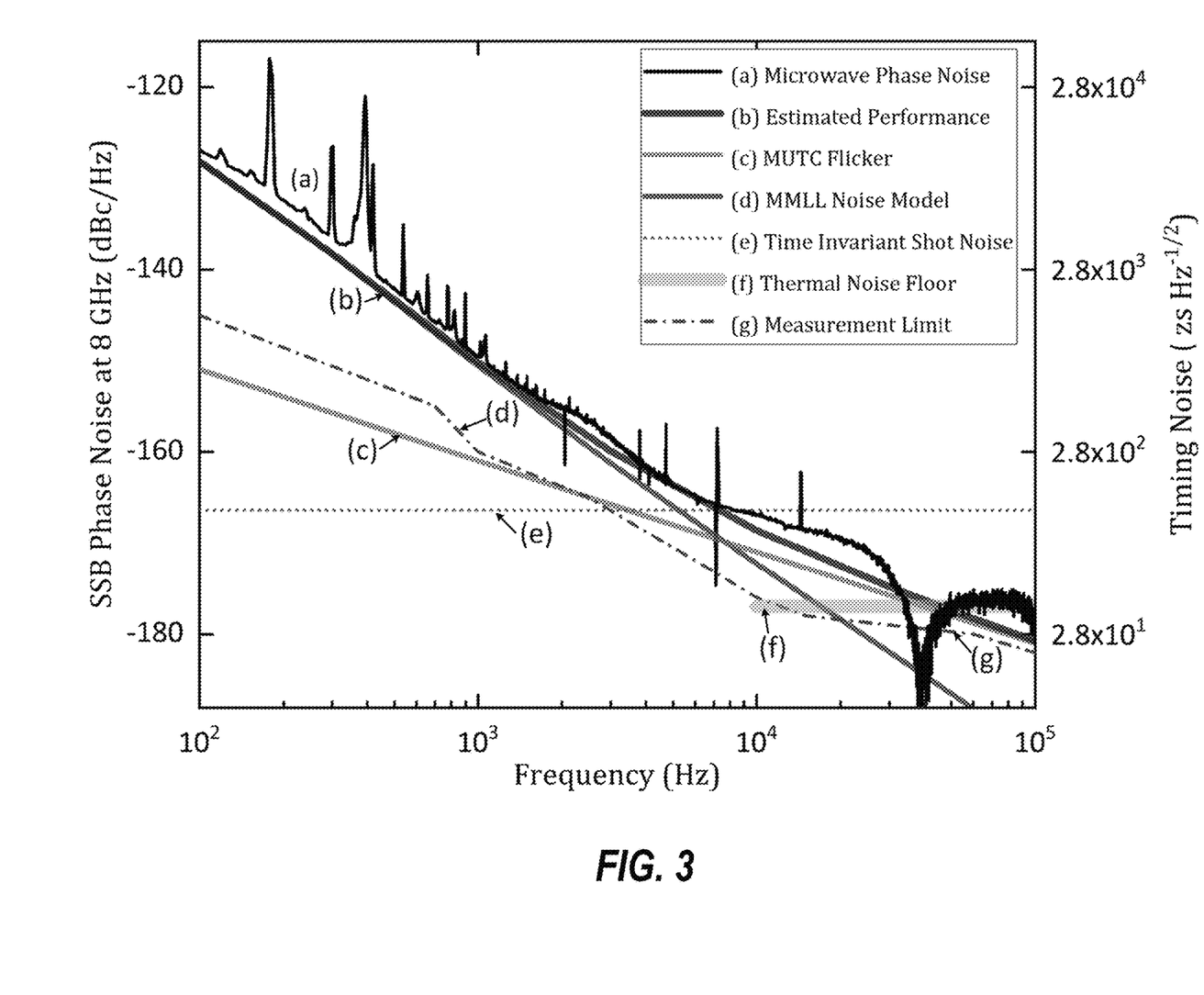
FIG. 3 shows single-sideband (SSB) phase noise measured for MMLL-based microwave generation. Curve (a) is the measured phase noise at the 8-GHz carrier. Curve (b) is the estimated phase noise performance. Curve (c) is the measured flicker noise of the modified uni-traveling carrier (MUTC) photodiode at 8 GHz following dBc/Hz. Curve (d) is the modeled quantum noise of the MMLL converted to 8 GHz. Curve (e) is the calculated time-invariant shot noise for a 7-mA photocurrent. Curve (f) is the thermal noise floor, corresponding to a timing noise of 32 zs $Hz^{-1/2}$. Curve (g) is the measurement limit approximated from the in-loop signals from reference comb. The dip in the SSB phase noise at 40 kHz is due to "cross-spectrum collapse".

Results and Discussions—FIG. 3 summarizes the results of the SSB phase noise present around the 8-GHz carrier. Curve (a) shows the measured phase noise. Curve (b) is the estimated noise performance of the system, calculated by adding the measured flicker noise of the MUTC detector (curve (c)) and the quantum-noise limited contribution from the free-running MMLL (curve (d)). Flicker noise of the MUTC for a 2 dBm carrier at 8 GHz is measured using the same dual DO-MZM setup. The noise of the MMLL at low offsets (<3 kHz) is dominated by classical RIN-driven self-steepening effects due to the slow saturable absorber used in the MMLL, which is eliminated by the aforementioned RIN feedback to the MMLL pump. Above 3 kHz, the Gorden-Haus timing jitter is dominant. The performance of the system above 10 kHz offsets is limited by the flicker noise of the MUTC and the 50Ω thermal noise floor (curve (f)). The measured noise generally agrees well with the calculated performance (see curves (a) and (b)). The dip in the phase noise measurements around 40 kHz is due to the "cross-spectrum collapse", an artifact of the dual-channel cross-spectrum method that is typically observed when the oscillator's noise approaches the thermal noise limit of the 50Ω system. The source of this effect is the thermal noise originating from the isolation resistor from the Wilkinson splitter (see "Splitter" in FIG. 2), which appears anti-correlated between the two outputs. The cross-spectrum measures the differential thermal noise between the power splitter and the oscillator, underestimating the true phase noise of the oscillator at the thermal noise floor. It has been shown that the cryogenic cooling of the splitter can reduce this effect. The sharp peaks below 1 kHz and bumps near 2.5 kHz and 20 kHz are related to acoustic noise and RIN servos of the optical reference comb, respectively. The measurement limit inferred from in-loop signals of optical reference is shown in the dashed grey curve (curve (g)) At offsets above 100 kHz, the phase noise of the system is fully limited by the Johnson noise, and is therefore frequency independent.

At sufficiently high photocurrents, the microwave phase noise floor is limited by the shot noise, which arises from the discrete nature of the impinging photons on the photodiode. Generally, shot noise is treated as a Poisson process, and the one-sided power spectral density for a photocurrent I is given by $S_i(f)=2qI$ where q is the electron charge. In the detection of ultrashort optical pulse trains, however, the photon statistics strongly depend on the optical pulse width and the pulse timing interval, and therefore, cannot be treated as a continuous, statistically independent distribution. These shot noise correlations can be exploited to improve the fundamental shot noise limit by several orders of magnitude. For example, for a sech$^2$-shaped pulse train with a repetition rate f and full width at half maximum (FWHM) pulse duration Δt, it can be shown that the shot noise limited phase noise floor is improved by a factor β, $$\beta=[1-\pi^2 f\tau_s \times csch(\pi^2 f\tau_s)], \quad (1)$$

where $\tau_s$ is the time scaling parameter given by Δt/1.763. In our measurements, we observe about 12 dB sub-Poissonian shot noise floor improvement, more than 6 dB better than the previously reported values. This Johnson-noise-limited phase noise floor corresponds to the timing noise of 32 zs Hz$^{-1/2}$.

Figure 4:
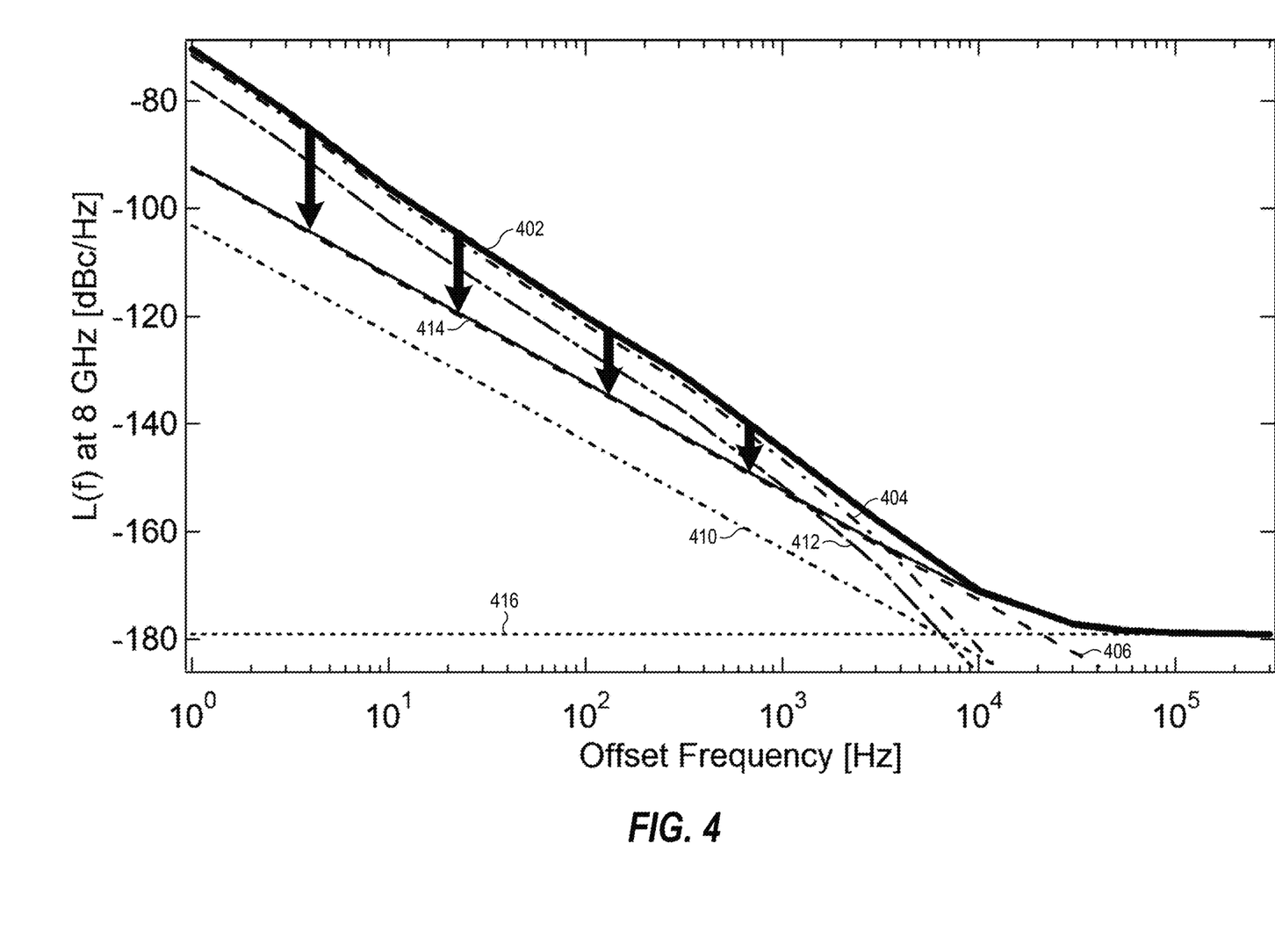
FIG. 4 is a plot showing the improvement in the SSB phase noise due to the laser RIN servo.

FIG. 4 is a plot showing the improvement in the SSB phase noise due to the laser RIN servo (e.g., the beamsplitter 120, feedback photodiode 122, and servo amplifier 124 of FIG. 1). The curve 402 is the total SSB phase noise when the laser RIN servo is off, while the curve 414 is the total SSB phase noise when the laser RIN servo is on. As indicated by the four downward-pointing arrows, the laser RIN servo decreases the SSB phase noise by more than 20 dB at 1 Hz off of an 8-GHz carrier. The decrease in SSB phase noise continues out to 10 kHz, where the curves 402 and 414 meet. At offset frequencies less than 3 kHz, and when the laser RIN servo is off, the curve 402 is primarily determined by the curve 404, which is the SSB phase noise due to the slow saturable absorber. When the laser RIN servo is on, the curve 414 is primarily determined by the curve 406, which is the SSB phase noise due to Gordan-Haus timing jitter. At offset frequencies above 10 kHz, the curves 402 and 414 are both limited by the curve 416, which is the 50Ω thermal noise floor due to the output impedance of the photodiode circuit (e.g., the high-frequency output port of the frequency multiplexer 150 of FIG. 1). For comparison, FIG. 4 also shows the ASE direct contribution to timing (see the curve 410) and the self-steepening effect (the curve 412). FIG. 4 therefore shows that the laser RIN servo significantly suppresses phase noise due to the slow saturable absorber (curve 404) and the self-steepening effect (curve 412), such that that these two effects are no longer the dominant sources of phase noise at offset frequencies less than 10 kHz off the carrier.

Phase Noise Model of Free-Running MMLL—The most significant sources of the MMLL are amplified spontaneous emission (ASE), Gordon-Haus jitter (GH), self-steepening (SS), and noise due to the slow saturable absorber. ASE noise comes from the spontaneous emission of the gain medium, which perturbs the temporal position of the pulse. This ASE noise can also introduce shifts in the center frequency of the laser's optical spectrum, which alters the group velocity of the pulse due to the dispersion of the cavity. This is known as Gordon-Haus jitter. The self-steepening noise occurs due to the Kerr effect, which causes a change in the group velocity and couples the amplitude-to-phase noise. In a slow saturable absorber, the front slope of the pulse experiences a greater attenuation than the trailing slope. This causes a change in the pulse shape, shifting the center of the pulse in the time domain, which also introduces phase noise. The relevant phase noise expressions for these noise sources are shown below as the single-sideband (SSB) spectral density $\mathcal{L}(f)$.

Amplified Spontaneous Emission (ASE):

$$\beta=[1-\pi^2 f\tau_s \times csch(\pi^2 f\tau_s)], \quad (2)$$

where f is the offset frequency away from the carrier $f_{osc}$, $f_{rep}$ is the pulse repetition rate, P is the average intracavity power, θ is the excess noise factor of the gain, g is the round-trip cavity loss, hv is the photon energy, and τ is the FWHM pulse duration.

Gorden Haus Jitter:

$$\mathcal{L}_{GH}(f) \approx L_{ASE} \times \frac{D^2 \Gamma_g^2}{g^2 + 9.26\left(\frac{f}{f_{rep}}\right)^2 \Gamma_g^4 \tau^4} \quad (3)$$

where D is the intra-cavity group delay dispersion and $\Gamma_g$ is the half width half maximum (HWHM) gain bandwidth.

Self-Steepening Noise:

$$\mathcal{L}_{ss}(f) = \frac{1}{2}\left(\frac{f_{rep}f_{osc}\varphi_{NL}}{\pi f v}\right)^2 S_{RIN}(f) \tag{4}$$

where $\varphi_{NL}$ is the total non-linear phase shift for round trip.

Slow Saturable Absorber Response:

$$\mathcal{L}_{SSA}(f) = \frac{1}{2}\left(\frac{f_{rep}f_{osc}}{f}\frac{\partial \Delta t}{\partial s}s\right)^2 S_{RIN}(f) \tag{5}$$

where s is the ratio of the pulse energy over the absorber saturation energy, and $\Delta t$ is the timing shift arising from the slow response of the absorber.

Optical reference—For the microwave measurements, we use a traditional OFD system as the optical reference. This reference OFD uses a 1550 nm CW laser (NKT photonics, Koheras BASIK MIKRO E15) locked to a high-finesse ULE cavity with the finesse of ~400,000 (not shown in FIG. 2) via the Pound-Drever-Hall (PDH) locking scheme. The high-finesse cavity is placed inside a temperature-controlled vacuum chamber. In the PDH locking, an additional servo loop is used to the RF input of the electro-optic modulator for further suppressing the residual phase noise of the error signal at high bandwidths, enabling the very low phase noise floor shown as the "measurement limit" in FIG. 3). The OFC is a homemade solid-state Er-laser with a 500-MHz fundamental pulse repetition rate. A SESAM is used to initiate and maintain mode-locking. The $f_{rep}$ of the laser is tuned by moving mirrors of the laser cavity using piezo modulators. The carrier-envelope offset frequency $f_{ceo}$ of f the OFC is locked to an external local oscillator using an f-2f interferometer. The OFC is tightly phase-locked to the cavity-stabilized CW laser using the heterodyne beat between the CW laser and single longitudinal mode of the OFC. The SNR of both beat notes ($f_{ceo}$ and $f_{rep}$) are about 60 dB at a 100-kHz resolution bandwidth, ultimately enabling a shot-noise limited comb performance resulting in a −197 dBc/Hz noise floor at 8 GHz DUT frequencies.

Electro-optical sampling—The output from the MUTC is sent through an 8-GHz bandpass filter (BPF, Mini-Circuits, ZBSS-7975-S+) to filter out unwanted harmonics. The filtered 8-GHz signal is then divided into two equal parts using a Wilkinson power splitter (Splitter, Mini-Circuits, ZN2PD-02183-S+). Each section is sent through an isolator, phase shifter, and an 8-GHz amplifier (Custom MMIC, CMD274P4) and then sent into the RF port of each DO-MZM. The DO-MZM is used to sample the microwave signal against the stabilized optical reference described above. About 10 mW of the optical power of the stabilized reference OFC is divided into two using a PM-fiber 50:50 beam splitter and then fed into each DO-MZM, for the microwave-to-optical comparison. The optical output pairs from each DO-MZM are detected using balanced photodiodes (BPD) (about 2 mW of optical power on each diode). The balanced signal is then amplified via transimpedance amplifiers (TIAs), followed by low-noise voltage amplifiers (LNAs). The power spectral density (PSD) of each output is measured using a field-programable gate array (FPGA) board with two-channel input (modified Red Pitaya STEM-Lab 125-14). The time-averaged cross-spectrum between the two channels yields the desired phase-noise data, free of statistically independent instrumentation noise present in each channel. The latter includes flicker noise of the DO-MZMs, RF amplifiers and the baseband diodes, as well as electronic noise from RF and baseband amplifiers, and shot-noise due to the 2 mA of baseband current on each diode. Two separate power supplies are used to minimize common-mode supply noise between two channels. The carrier power of each channel, measured by unlocking the slow phase lock between optical reference and MMLL, is used to convert the PSD to SSB phase noise. A commercial X-band yttrium iron garnet (YIG) oscillator is used as DUT to further confirm the calibration of the measurement setup by comparing it against a phase noise measurement of a commercial signal analyzer (Keysight, N9030A PXA).

MUTC flicker noise measurement—Flicker noise of the MUTC for a 2 dBm carrier at 8 GHz is measured using the same dual DO-MZM setup. For this, the optical output power of the MMLL is divided into two using a beam splitter (BS). One part of the light is used for the microwave generation setup, and the other half served as the optical reference. In this configuration, the laser noise is a common mode and cancels out in the baseband. The remaining noise includes all technical limitations of the setup, including the flicker noise of the MUTC. For calibration, a YIG oscillator with the same carrier power (2 dBm) is used and confirmed against a phase noise measurement with the commercial signal analyzer.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A photonic-based microwave generator, comprising:
   a mode-locked laser configured to generate an optical pulse train;
   a feedback photodiode configured to generate, in response to detecting at least a portion of the optical pulse train, an error signal indicating relative intensity noise of the optical pulse train; and
   a servo amplifier configured to process the error signal into a servo signal that controls intracavity power of the mode-locked laser to suppress the relative intensity noise of the optical pulse train;
   wherein the mode-locked laser is configured such that timing jitter of the optical pulse train is reduced in response to the suppressed relative intensity noise.

2. The photonic-based microwave generator of claim 1, the servo signal controlling one or both of (i) pump light that pumps the mode-locked laser and (ii) intra-cavity loss of the mode-locked laser.

3. The photonic-based microwave generator of claim 1, the mode-locked laser being monolithic.

4. The photonic-based microwave generator of claim 1, further comprising a microwave photodiode configured to convert the optical pulse train into an electronic microwave signal.

5. The photonic-based microwave generator of claim 4, further comprising a pulse interleaver configured to interleave the optical pulse train into an interleaved pulse train;

wherein the microwave photodiode is configured to convert the interleaved pulse train into the electronic microwave signal.

6. The photonic-based microwave generator of claim 4, further comprising an optical amplifier configured to amplify the optical pulse train into an amplified pulse train;
wherein the microwave photodiode is configured to convert the amplified pulse train into the electronic microwave signal.

7. The photonic-based microwave generator of claim 4, further comprising:
an optical modulator configured to modulate an optical power of the optical pulse train; and
a second servo amplifier configured to process an output of the microwave photodiode into a second servo signal;
wherein the microwave photodiode, optical modulator, and second servo amplifier cooperate, when the second servo signal drives the optical modulator, to suppress amplitude noise of the electronic microwave signal.

8. The photonic-based microwave generator of claim 1, configured to suppress the relative intensity noise of the optical pulse train while the mode-locked laser is free-running.

9. A photonic-based microwave generator, comprising:
an optical modulator configured to modulate an optical power of thean optical pulse train;
a microwave photodiode configured to convert the optical pulse train into an electronic microwave signal; and
a servo amplifier configured to process an output of the microwave photodiode into a servo signal;
wherein the microwave photodiode, optical modulator, and servo amplifier cooperate, when the servo signal drives the optical modulator, to suppress amplitude noise of the electronic microwave signal.

10. The photonic-based microwave generator of claim 9, further comprising an optical amplifier configured to amplify the optical pulse train into an amplified pulse train;
wherein (i) the microwave photodiode is configured to convert the amplified pulse train into the electronic microwave signal and (ii) the optical modulator is configured to modulate an optical power of the amplified pulse train.

11. The photonic-based microwave generator of claim 9, further comprising a mode-locked laser configured to generate the optical pulse train.

12. A method for photonic-based microwave generation, comprising:
generating an optical pulse train with a mode-locked laser; and
suppressing relative intensity noise of the optical pulse train by:
detecting, with a feedback photodiode, at least a portion of the optical pulse train to generate an error signal indicating relative intensity noise of the optical pulse train;
processing the error signal into a servo signal; and
controlling intracavity power of the mode-locked laser with the servo signal;
wherein timing jitter of the optical pulse train is reduced in response to the suppressed relative intensity noise.

13. The method of claim 12, wherein said controlling comprises one or both of:
controlling pump light that pumps the mode-locked laser; and
controlling intra-cavity loss of the mode-locked laser.

14. The method of claim 12, the mode-locked laser being monolithic.

15. The method of claim 12, the mode-locked laser being free-running.

16. The method of claim 12, further comprising converting, with a microwave photodiode, the optical pulse train into a microwave electronic signal.

17. The method of claim 16, further comprising coupling the electronic microwave signal to a microwave circuit.

18. The method of claim 16,
further comprising interleaving the optical pulse train into an interleaved pulse train;
wherein said converting includes converting the interleaved pulse train.

19. The method of claim 16,
further comprising amplifying the optical pulse train into an amplified pulse train;
wherein said converting includes converting the amplified pulse train.

20. The method of claim 16, further comprising suppressing amplitude noise of the electronic microwave signal by:
processing an output of the microwave photodiode into a second servo signal; and
driving an optical modulator with the second servo signal to modulate an optical power of the optical pulse train.

* * * * *